United States Patent [19]

Martin

[11] Patent Number: 4,643,333

[45] Date of Patent: Feb. 17, 1987

[54] EQUIPMENT CABINETS HAVING SLIDING CLOSURE

[75] Inventor: Sidney H. Martin, Mellor, Great Britain

[73] Assignee: International Computers Limited, London, England

[21] Appl. No.: 850,698

[22] Filed: Apr. 11, 1986

[30] Foreign Application Priority Data

Apr. 22, 1985 [GB] United Kingdom ............... 8510241

[51] Int. Cl.4 ............................................ B65D 43/20
[52] U.S. Cl. .................................................. 220/345
[58] Field of Search ....................... 220/345, 346, 353

[56] References Cited

U.S. PATENT DOCUMENTS 2,590,804 3/1952 Vitale .................................. 220/345
3,128,007 4/1964 Kops ................................... 220/345

Primary Examiner—George T. Hall
Attorney, Agent, or Firm—Lee, Smith & Zickert

[57] ABSTRACT

A cabinet for housing electronic equipment constructed entirely from plastics material. The cabinet comprises a base and panels all formed with integral parts which interlock to secure adjacent panels together thereby dispensing with the need for any structural framework. The cabinet is provided with a removable panel to allow access to its interior. Cam surfaces on the cabinet engage with complementary cam surfaces on the removable panel when the panel is slid into position to draw it into engagement with the cabinet. The inner surfaces of the panels have conductive coatings to provide screening against radio frequency interference and compressible electrically conductive gaskets are provided between the panels to form airtight seals and to maintain continuity of the screening.

4 Claims, 3 Drawing Figures

EQUIPMENT CABINETS HAVING SLIDING CLOSURE

BACKGROUND OF THE INVENTION

This invention relates to the construction of cabinets and housings to contain electronic equipment such as electronic computers.

It has been common to construct such cabinets from sheet metal formed to provide structural bracing or to use sheet metal panels secured to a metal frame. The interior of the cabinet has to be provided with fittings on which the electronic equipment is mounted. A hinged door is usually provided to protect the internal equipment from damage and to prevent accidental injury to personnel using the equipment. A gasket is often provided between the door and the cabinet both to provide an airtight seal so that cooling air does not have an egress between the door and the cabinet and to provide continuity in the screening against radio frequency interference. For this latter purpose the gasket is conductive. A latch mechanism ensures that the door and cabinet are drawn into engagement with the gasket interposed therebetween. Such constructions of cabinet are somewhat labour intensive and hence are costly to manufacture.

In order to reduce the cost of manufacture of cabinets, it has been proposed to construct the cabinets of mouldings of plastics material. The use of mouldings of plastics material permits a considerable simplification in the manufacturing process because a complex panel or other structural unit may be formed in a single moulding operation and the individual panels may be formed with integral means which interlock with adjacent panels thereby dispensing with the need for any structural framework. However, due to the inherent flexibility of moulded plastics panels it is necessary to provide interlocking means between panels at relatively closely spaced intervals. This is especially important when the cabinet is utilised to provide screening against radio frequency interference. Since the plastics material is electrically non-conductive, the inner surface of the panels is coated with a conductive layer. This may be accomplished by spray coating with conductive paint. In order to ensure that the conductive layer has no electrical discontinuities between adjoining panels, means are provided to electrically bond the conductive layers together. Where fixed panels adjoin one another it is relatively easy to ensure that they are mechanically interlocked to provide a relatively rigid assembly and to ensure the continuity of the inner conductive coating. However, in order to be able to maintain and service the equipment housed in the cabinet it is necessary to provide at least one panel which is easily removable. In metal cabinets it is common to provide a hinged door with a latch for this purpose because the door is relatively rigid and the rigidity of the cabinet does not depend upon interaction with the door.

SUMMARY OF THE INVENTION

According to the invention a cabinet for housing electronic equipment having an opening for permitting access to its interior and a panel for closing said opening includes: first cam means provided on the cabinet; and second cam means provided on the panel for engagement with said first cam means; the first and second cam means being engaged by moving the panel relative to the cabinet with a sliding motion across the opening, such movement being effective to draw the panel into seating contact with the cabinet.

BRIEF DESCRIPTION OF THE DRAWINGS

An embodiment of the invention will now be described with reference by way of example to the drawing, in which.

PREFERRED EMBODIMENT OF THE INVENTION

Figure 1:
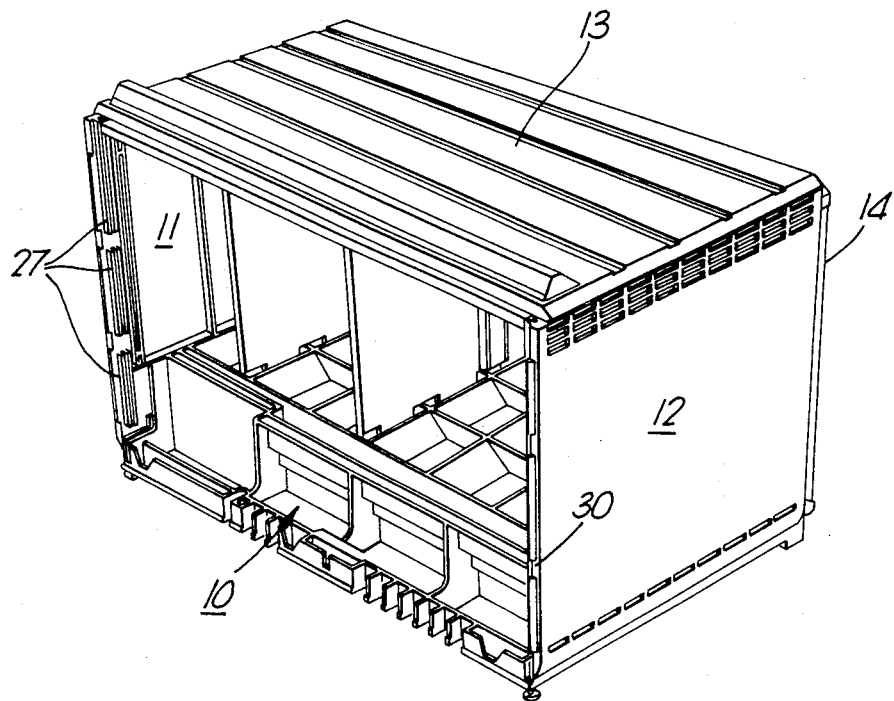
FIG. 1 is a view of a cabinet for housing electronic equipment.
Figure 3:
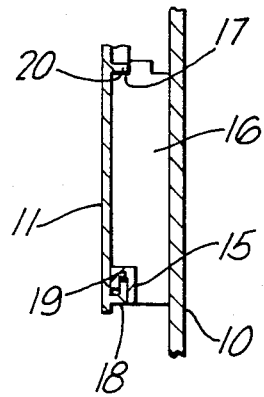
FIG. 3 illustrates the assembly of a side panel to a base moulding of the cabinet.
Figure 2:
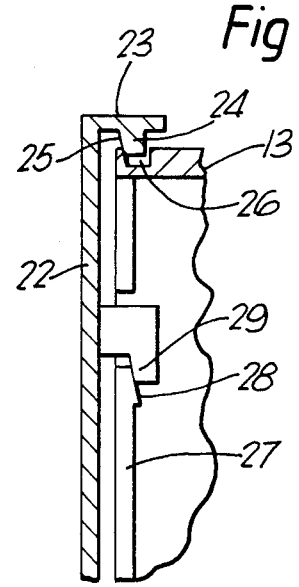
FIG. 2 illustrates the interlocking engagement between a removable panel and the cabinet.

Referring to the drawings, a cabinet for housing electronic equipment such as a computer, comprises a base 10, side panels 11, 12, a top panel 13 and a rear panel 14. The panels and base are mouldings of plastics material and they are formed with means which engage or interlock with means on adjoining panels, whereby the cabinet can be assembled by interlocking of the mouldings one with another. The inner surfaces of the panels and the base are coated with conductive paint. An example of this is illustrated in FIG. 3, where the base 10 has an inverted channel 15 and spaced vertically extending ribs 16 on each side wall. The upper ends of the ribs 16 terminate in a shoulder 17. The side panels 11, 12 of the cabinet, of which a part of panel 11 is shown in FIG. 3, are formed adjacent their lower edge with a flange 18. A compressible conductive gasket 19 is inserted in the inverted channel 15 and the side panel 11 is assembled onto the base 10 by inserting the flange 18 into the channel 15 and then by pivotting the panel to cause a rib 20 on the panel to engage the shoulders 17 on the base and cause the flange to compress the gasket. Thus the gasket provides electrical continuity between the conductive coatings on the side panel and the base. The top panel is provided with downwardly extending portions having tapered recesses which engage with similarly tapered parts adjacent the upper edges of the side panels. The top panel is assembled to the side panels by placing the top panel on the side panels and then sliding it either forwards or backwards to draw the tapered parts into the tapered recesses. Clips may be utilised to prevent disengagement of these panels. A removable front panel 22 is provided which has an upper edge consisting of a lip 23 extending rearwardly. The under side of the lip 23 has projections 24 with cam surfaces 25 which engage in recesses 26 in the upper panel. The front edges of the side panels 11, 12 are formed on the inner surface with ribs 27 which have cam surfaces 28 at their upper ends. The side edges of the front panel 22 carry rearwardly extending portions having cam surfaces 29 arranged for engagement with the cam surfaces 28 on the side panels. A locking mechanism is provided on the base 10 which has a hook adapted to engage a pin on the front panel. Engagement of the hook with the pin is effected by rotation of a shaft and after such engagement has been effected, the hook is prevented from further rotation with the shaft but continued rotation of the shaft causes a cam to draw the hook and hence the pin and front panel downwards. Thus the cam surfaces 25 and 29 of the front panel engage with the slots 26 and the cam surfaces 28 on the top and side panels respectively. Also further cam surfaces adjacent the bottom edge of the front panel engage in slots in the base 10. After initial engagement of the cam surfaces on the door with those on the cabinet, rotation of the locking mechanism draws the front panel downwards to cause the interengaging cam surfaces to seat the front panel firmly against the cabinet. A compressible electrically conductive gasket is positioned between the front panel and the cabinet. Reverse rotation of the locking mechanism causes an eccentric thereon to urge the front panel upwardly to release it from the cabinet. In order to make the cabinet assembly more rigid, the side panels 11, 12 are provided on their front edges with tapered ribs 30 which enter into slots in the rear face of the front panel. The slots are longer than the ribs to permit the front panel to slide upwards and downwards.

I claim:

1. A cabinet for housing electronic equipment having an opening for permitting access to its interior and a panel for closing said opening including: first cam means provided on the cabinet; and second cam means provided on the panel for engagement with said first cam means; the first and second cam means being engaged by moving the panel relative to the cabinet with a sliding motion across the opening, such movement being effective to draw the panel into seating contact with the cabinet.

2. A cabinet as claimed in claim 1, in which said first cam means are provided at a plurality of locations around the opening of the cabinet.

3. A cabinet as claimed in claim 2, including elongate slots in the panel and corresponding projections extending from the cabinet around said opening, the projections engaging the slots when the panel is in seating contact with the cabinet.

4. A cabinet as claimed in claim 1, including conductive screening layers on the inside of the cabinet and the panel and further including a compressible electrically conductive gasket situated between the cabinet and the panel.

* * * * *